United States Patent
Tsukamoto

(10) Patent No.: US 7,452,813 B2
(45) Date of Patent: Nov. 18, 2008

(54) METHOD OF MANUFACTURING SEMICONDUCTOR DEVICE HAVING PLANARIZED INTERLAYER INSULATING FILM

(75) Inventor: Takeo Tsukamoto, Tokyo (JP)

(73) Assignee: Elpida Memory, Inc., Tokyo (JP)

( * ) Notice: Subject to any disclaimer, the term of this patent is extended or adjusted under 35 U.S.C. 154(b) by 279 days.

(21) Appl. No.: 11/366,433

(22) Filed: Mar. 3, 2006

(65) Prior Publication Data

US 2006/0199389 A1 Sep. 7, 2006

(30) Foreign Application Priority Data

Mar. 4, 2005 (JP) ............... 2005-060355

(51) Int. Cl.
*H01L 21/302* (2006.01)
(52) U.S. Cl. ............. 438/689; 438/692; 438/693; 438/723
(58) Field of Classification Search ........ 438/689, 438/690, 691, 692, 693, 706, 712, 723, 724
See application file for complete search history.

(56) References Cited

U.S. PATENT DOCUMENTS

| | | | |
|---|---|---|---|
| 6,110,795 A * | 8/2000 | Liao ............. | 438/424 |
| 6,350,694 B1 * | 2/2002 | Chang et al. ........ | 438/692 |
| 6,967,375 B2 * | 11/2005 | Gehres et al. ....... | 257/347 |
| 2002/0117686 A1 * | 8/2002 | Lee et al. ........ | 257/200 |
| 2004/0142553 A1 * | 7/2004 | Kim .............. | 438/622 |
| 2005/0151192 A1 * | 7/2005 | Gehres et al. ....... | 257/347 |

FOREIGN PATENT DOCUMENTS

| | | |
|---|---|---|
| JP | 10-335460 | 12/1998 |
| JP | 2000-124189 | 4/2000 |
| JP | 2000-124193 | 4/2000 |
| JP | 2001-267411 | 9/2001 |
| JP | 2002-252210 | 9/2002 |
| JP | 2002-270557 | 9/2002 |
| JP | 2004-193510 | 7/2004 |

* cited by examiner

*Primary Examiner*—Kin-Chan Chen
(74) *Attorney, Agent, or Firm*—McGinn IP Law Group, PLLC

(57) ABSTRACT

A method of manufacturing a semiconductor device according to the present invention, comprising the steps of: forming a first insulating film on a substrate that is provided with a structure; forming a second insulating film on the first insulating film; polishing at least the second insulating film; forming a third insulating film on the polished second insulating film; and etching a remaining film including at least the second insulating film or the third insulating film so that an exposed surface of the second insulating film and the third insulating film is parallel with a surface of the substrate.

20 Claims, 4 Drawing Sheets

METHOD OF MANUFACTURING SEMICONDUCTOR DEVICE HAVING PLANARIZED INTERLAYER INSULATING FILM

BACKGROUND OF THE INVENTION

1. Field of the Invention

The present invention relates to a method of manufacturing a semiconductor device having structures such as wirings and gate electrodes.

2. Description of the Related Art

In many cases, a semiconductor device is provided with a multilayer wiring structure in which a plurality of wiring layers is laminated. In the multilayer wiring structure, an insulating film in a lower layer for wirings is preferably planarized, and the CMP (Chemical and Mechanical Polishing) process is carried out for planarization of the insulating film.

The conventional method of manufacturing the semiconductor device is explained. FIGS. 1A and 1B are schematic cross-sectional views showing the conventional process of manufacturing a semiconductor device.

After semiconductor elements such as a transistor and a capacitor (not shown) are formed on a silicon substrate, primary insulating layer 25 is formed in order to ensure electrical insulation among the semiconductor elements. In the following, not limited to the silicon substrate, a term of "substrate" is used for those substrates including silicon substrates on which semiconductor elements and wirings are formed in the process of manufacturing.

Successively, on primary insulating layer 25, a film of tungsten that is 600 nm in thickness is deposited, and then wirings 24 of 600 nm in height are formed by the lithography process and the etching process. After that, LP (Low Pressure)-TEOS (Tetra Ethyl Ortho Silicate) oxide film 23 that is 300 nm in thickness, which is conducive to embedding, is formed so as to cover wirings 24. Then, on LP-TEOS oxide film 23, plasma oxide film 22 having a thickness of 700 nm is formed (FIG. 1A).

Since the cross-sectional view shown in FIG. 1A is a schematic view showing a cross-section taken along a line passing the center of the substrate, both ends of the cross-section in FIG. 1A are ends of the substrate and the central part of the cross-section is in the vicinity of the center of the substrate. To simplify explanations, in this schematic view, two peripheral regions and one central region are shown as formation regions of semiconductor devices, and cross-sections of three wirings are shown in each formation region. Also, the formation region of the semiconductor device approximately corresponds to the size of one chip.

As is apparent from this schematic view, in the region where the wiring formation density is high like as in a chip, LP-TEOS oxide film 23 is buried also between the wirings, and therefore the surface of plasma oxide film 22 formed thereon is flat. On the other hand, between the chips, the wiring formation density is low, and therefore LP-TEOS oxide film 23 is formed along the upper face of primary insulating layer 25. Accordingly, step heights corresponding to the heights of wirings 24 are generated in the vicinity of the peripheries of the chips. The step shapes appear on the surface of plasma oxide film 22 formed on LP-TEOS oxide film 23.

As shown in FIG. 1A, step heights corresponding to the heights of wirings 24 are formed on the surface of plasma oxide film 22. When wirings are formed on plasma oxide film 22, as it is, a problem occurs in that wiring materials remain as spacers on side walls of the step heights in the regions where the wiring materials must be removed. For that reason, as shown in FIG. 1B, silicon oxide film is polished by the CMP process until the step heights in plasma oxide film 22 are eliminated.

In the CMP process, the process condition is determined so that the polishing amount is about 500 nm on average on the surface by performing the process for a predetermined time. The value of amount that is polished is obtained from the measurement for the thickness of plasma oxide film on monitor wafer in which the film is formed on a silicon substrate having no patterns such as wirings thereon (hereinafter, called monitor wafer).

When the CMP process is performed, there is a problem in that scratch 26, namely, slight flaw, is generated in the surface of the film to be polished. A sight scratch in which elements such as width, length, and depth are smaller than 200 nm has little effect on a product, as it is, and has frequently little effect on the production such as the quantity yields of products that can be manufactured. On the contrary, a scratch larger than 200 nm cannot be disregarded. Japanese Patent Laid-Open No. 2002-270557 discloses measures against large scratches, wherein an insulating film is formed after the CMP process, and then etch-back for etching the insulating film evenly is performed so that the insulating film is buried into the scratches.

In the above-described CMP process, caused by unevenness of the surface in the CMP process, the polishing amount is smallest in the center of the substrate, and is largest in the periphery. When the process is performed while the polishing amount is set to 500 nm, the actual amount that is polished is about 450 nm in the center of the substrate and is about 550 nm in the periphery. These values of amounts that are polished are obtained from the measurements of thickness of film on monitor wafer. Therefore, variations of ±10% are generated in the amount that is polished in the substrate. Accordingly, when the method disclosed in the above-described Patent Document is performed, the insulating film is buried into the scratches, the variations in the amount that is polished by the CMP process are allowed to be transferred to the silicon oxide film for covering the wirings.

Further, when the etch-back amount in the periphery is larger than that in the center, planarization becomes still worse. When planarization becomes worse, at the time of forming wirings thereafter, variations in the photoresist size of the lithography process in the substrate increase, and variations in etching of the etching process in the substrate increase. As a result, size variations in wirings in the substrate increase, and there is a possibility that production yields may be reduced.

SUMMARY OF THE INVENTION

It is an object of the present invention to provide a method of manufacturing a semiconductor device for reducing scratches generated during polishing and for reducing variations in the amount that is polished.

A method of manufacturing a semiconductor device according to the present invention, comprising the steps of: forming a first insulating film on a substrate that is provided with a structure; forming a second insulating film on the first insulating film; polishing at least the second insulating film; forming a third insulating film on the polished second insulating film; and etching a remaining film including at least the second insulating film or the third insulating film so that an exposed surface of the second insulating film and the third insulating film is parallel with a surface of the substrate.

According to the present invention, even if a scratch is generated in any step of polishing, a third insulating film is buried into the scratch, and even if the amount that is polished varies in the substrate in any step of polishing, the variations are prevented. Accordingly, planarization in the surface of the insulating film is improved.

The above and other objects, features, and advantages of the present invention will become apparent from the following description with reference to the accompanying drawings which illustrate examples of the present invention.

DETAILED DESCRIPTION OF THE PREFERRED EMBODIMENTS

In the method of manufacturing the semiconductor device according to the present invention, an insulating film is formed after the CMP process, and etching is performed so that the surface of the insulating film is flat.

First Embodiment

A semiconductor device according to the first embodiment is provided with a semiconductor element, and a wiring for connecting a terminal of the semiconductor element to another terminal is also provided. As the semiconductor device, DRAM (Dynamic Random Access Memory) is mentioned. The DRAM is provided with a plurality of memory elements, and a peripheral circuit for selecting arbitrary memory elements. Also, wirings for connecting the memory elements and the peripheral circuit are provided.

Figure 1A:
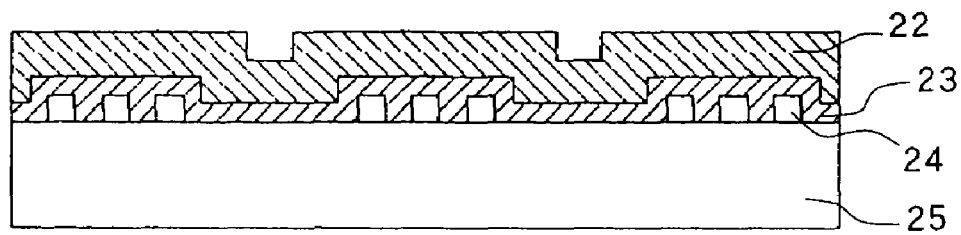
FIGS. 1A and 1B are schematic cross-sectional views showing the conventional process of manufacturing the semiconductor device.
Figure 1B:
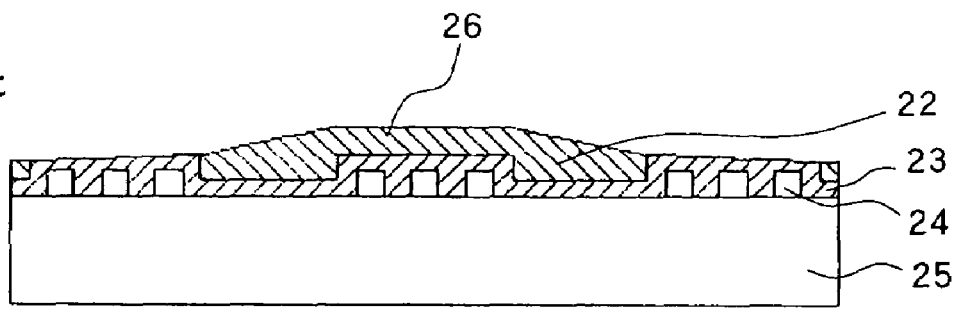

The method of manufacturing the semiconductor device according to this embodiment is explained. FIGS. 2A to 2D are schematic cross-sectional views showing a process of manufacturing a semiconductor device according to this embodiment. Incidentally, similar to the schematic views shown in FIGS. 1A and 1B, to simplify explanations, FIGS. 2A to 2D show schematic cross-sections of two chips in the peripheral regions and one chip in the central region of the substrate.

Figure 2A:
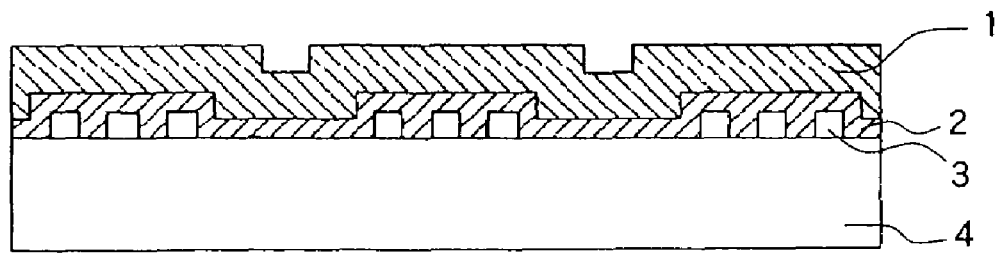
FIGS. 2A to 2D are schematic cross-sectional views showing a process of manufacturing a semiconductor device according to a first embodiment of the present invention.

After semiconductor elements (not shown) are formed on a silicon substrate, primary insulating layer 4 is formed in order to ensure electrical insulation among semiconductor elements. Successively, on primary insulating layer 4, a film of tungsten having a thickness of 600 nm is deposited, and then wirings 3 that are 600 nm in height are formed by the lithography process and the etching process. After that, LP-TEOS oxide film 2 having a thickness of 300 nm is formed on primary insulating layer 4 so as to cover wirings 3. Then, on LP-TEOS oxide film 2, first plasma oxide film 1 having a thickness of 700 nm is formed (FIG. 2A). In this embodiment, the wiring material for wirings 3 is tungsten, however, the wiring material for wirings 3 is not limited to tungsten, and may be other metal materials such as aluminum and copper and may be an alloy of a plurality of metal materials. Also, wiring materials may be a polysilicon film into which conductive impurities are doped.

Figure 2B:
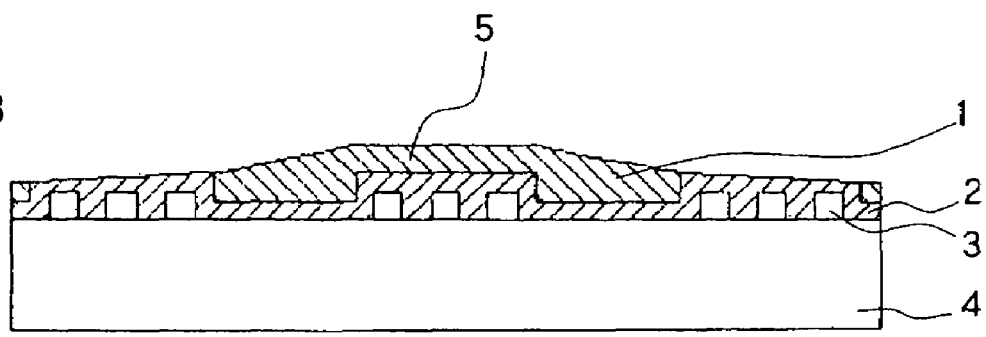

As shown in FIG. 2B, the silicon oxide film is polished by the CMP process until the step heights in first plasma oxide film 1 are eliminated. The condition of the CMP process is similar to that of the conventional method. The process is performed so that the amount that is polished is about 500 nm on average in the surface. The actual amount that is polished is about 450 nm in the center of the substrate and is about 550 nm in the periphery. These values of amounts that are polished are obtained from the measurements of thickness of film on monitor wafer.

Figure 2C:
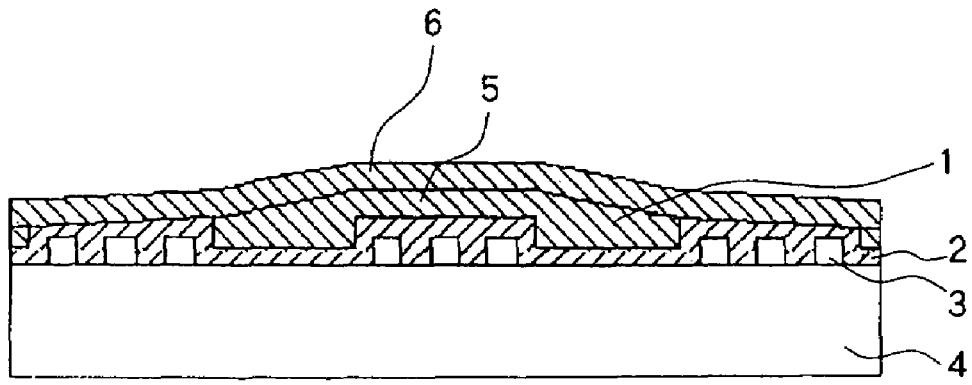

Successively, as shown in FIG. 2C, second plasma oxide film 6 having a thickness of 150 nm is formed. With this process, second plasma oxide film 6 is buried into slight scratch 5 that is approximately 300 nm or less in size, which is generated during the CMP process.

After that, in order to planarize the surface of the silicon oxide film against variations in the amount that is polished in the surface, a remaining film including first plasma oxide film 1 and/or second plasma oxide film 6 is subjected to etching in which the etching speed (etching rate) in the center of the substrate is faster than that in the periphery. Etching to any part in the surface of the substrate at a desired etching rate in this way is called local etching.

Figure 2D:
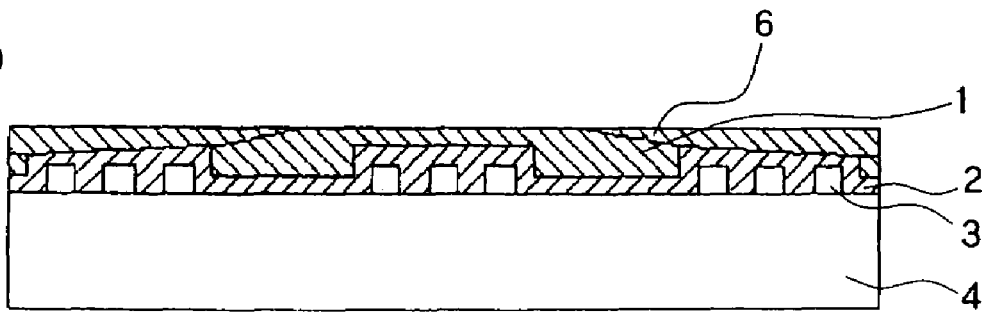

For the local etching process, the etching apparatus manufactured by Speedfam Co., Ltd. was used. The amount that was removed by local etching produced the result that 120 nm of silicon oxide film was removed in the vicinity of the center of the substrate and 20 nm was removed in the vicinity of the periphery. A greater amount of etching occurred in the part of the exposed surface of the silicon oxide film that is higher than the average and a smaller amount occurred in the part that is lower than the average so that variations in the amount that is polished according to the CMP process are reduced. Accordingly, as shown in FIG. 2D, the surface of the silicon oxide film is processed flatly and evenly. Also, scratches are eliminated by local etching or second plasma oxide film 6 is buried into scratches.

Next, local etching is explained briefly. Since local etching is disclosed in Japanese Patent Laid-Open Nos. 2000-124189, 2000-124193, and 2002-252210, detailed explanations thereof are omitted.

Figure 3:
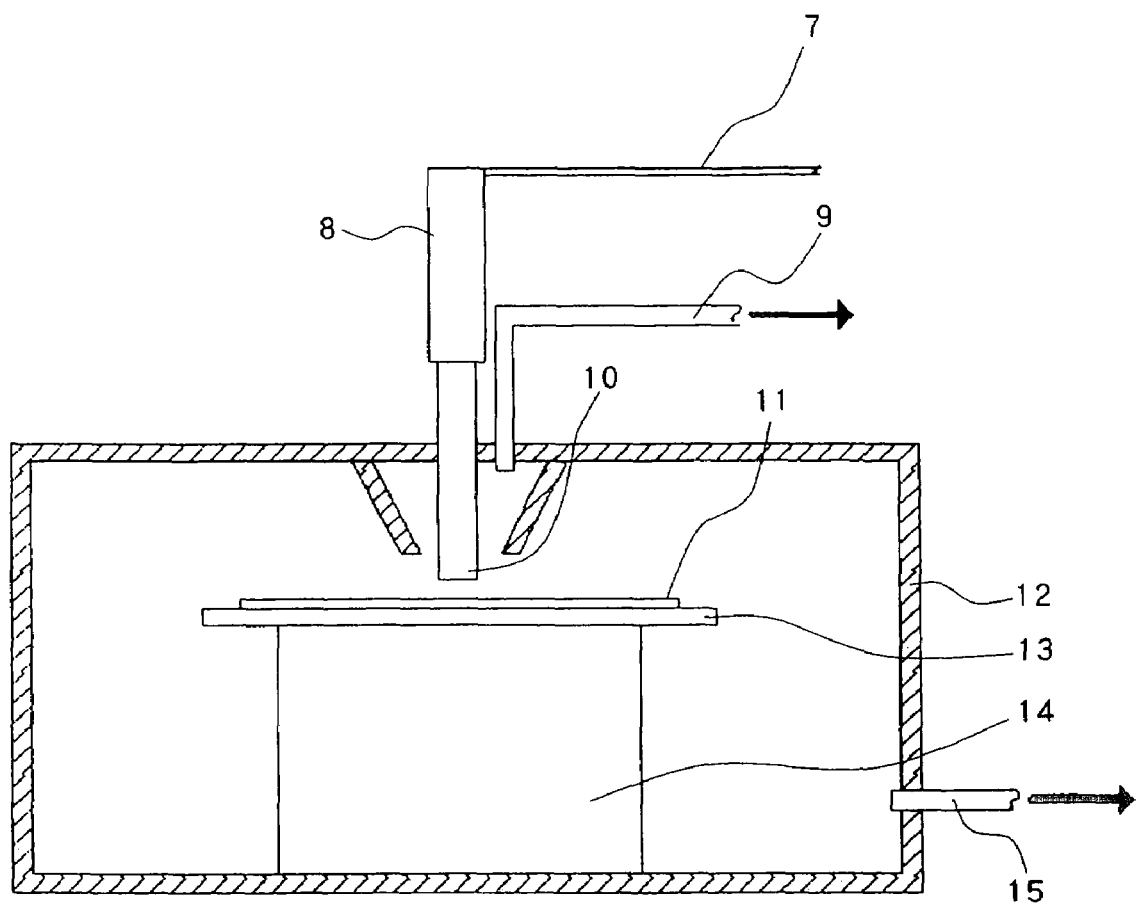
FIG. 3 is a schematic cross-sectional view showing a configuration example of an etching apparatus used in the first embodiment of the present invention.

FIG. 3 is a schematic cross-sectional view showing a configuration example of an etching apparatus used for the local etching.

As shown in FIG. 3, the etching apparatus is provided with gas supply pipe 7 for supplying etching gas, plasma generation section 8 for making the etching gas radical, nozzle 10 for jetting the radical gas to the surface of the substrate, chamber 12 as an etching process room, stage 13 on which substrate 11 is mounted, stage driving mechanism 14, and a computer (not shown) for controlling respective sections.

The computer is connected with plasma generation section 8 and stage driving mechanism 14, and is connected with signal lines for acquiring information from sensors in respective sections and with control lines for transmitting control signals to the respective sections. Gas supply pipe 7 is provided with a gas flow control unit (not shown), and the gas flow control unit is connected with the computer via the signal line and the control line. Chamber 12 is connected to a large exhaust pump (not shown) by exhaust pipe 9.

The large exhaust pump expels the gas in chamber 12 through exhaust pipe 9 in order to reduce the pressure in chamber 12 to a predetermined pressure. The large exhaust pump is connected with the computer via the signal line and control line. Also, exhaust pipe 9 is connected to the ceiling of chamber 12, and at the tip of exhaust pipe 9, a small exhaust pump (not shown) is provided. The small exhaust pump expels unreacted gas not used for etching through exhaust pipe 9.

Also, chamber 12 is provided with a lid unit (not shown) and a handling robot (not shown) used for mounting the substrate on stage 13 through the lid unit and for removing the substrate from stage 13. The lid unit and the handling robot are connected to the computer via the signal lines and the control lines.

Stage 13 is previously divided into plural parts of predetermined areas, and X-Y coordinates that are to be positional coordinates of all divided parts are registered. The computer, when a program for controlling the stage operation is executed, refers to the registered X-Y coordinates and makes stage driving mechanism 14 raster-scan so that the respective parts of the surface of the substrate mounted on stage 13 are exposed to the radical gas jetted from nozzle 10.

An operator can operate the computer to set moving speed of the stage 13 for each divided part in the program. In this embodiment, the moving speed of stage 13 is set to be fast in the part where the amount that is polished in the CMP process is large, and the moving speed of stage 13 is set to be slow in the part where the amount that is polished is small.

Next, the operation of the etching apparatus shown in FIG. 3 is explained briefly. $SF_6$ is used as the etching gas. Also, the above-described program is stored in the computer.

When the operator places a cassette stored with substrate on the etching apparatus and enters a command to start the process, the computer opens the lid unit via the control signal and has the handling robot take the substrate out from the cassette and mount the substrate on stage 13. Then, the computer closes the lid unit and has the large exhaust pump expel the gas until the pressure in chamber 12 reaches a predetermined value. When the pressure in chamber 12 reaches the predetermined value, the computer has stage driving mechanism 14 move stage 13 to a start position for the etching process.

After that, the computer controls the gas flow control unit so that material gas can be supplied at a predetermined flow, and $SF_6$ gas is supplied to plasma generation section 8 through gas supply pipe 7. Then, in plasma generation section 8, fluorine radicals are generated from $SF_6$ gas and are jetted from nozzle 10 to the surface of the substrate. When a jet of fluorine radicals is started, the computer makes stage 13 operate in a predetermined manner. At this time, in the part where the amount that is polished in the CMP process is small, the moving speed of stage 13 is set to be slow and the amount of time during which it will be exposed to the fluorine radicals is set to be long so that the etching amount becomes large. On the contrary, in the part where the amount that is polished in the CMP process is large, the moving speed of stage 13 is set to be fast and the amount of time during which it will be exposed to the fluorine radicals is set to be short so that the etching amount becomes small.

By controlling the time for exposing each part in the substrate to the fluorine radicals in this way, based on the variations in the amount that is polished in the CMP process, for each exposed part, the smaller the amount that is polished, the larger is the amount that is etched.

Further, contrary to the above description, when the amount that is polished in the CMP process is large in the center and is small in the periphery, the etching apparatus may be set so that the amount that will be removed by local etching is small in the center and is large in the periphery.

Next, reasons for forming the second plasma film are explained. If the second plasma film is not formed after the CMP process and local etching is performed for planarization, there will be a possibility that the following problem occurs.

The problem is that the scratch is enlarged. In the vicinity of the center in the substrate, the amount that will be removed by local etching is set to about 120 nm as described above. Therefore, when a scratch of, for example, 200 nm in width is generated after the CMP process and the etching is performed in both directions, the width becomes about 440 nm (=200+120+120) at the maximum. When wirings are formed after this, there is a possibility that wiring materials remain in the scratch. When wiring materials remain in the scratch and inside its shape thereof, they cause a plurality of wirings formed over the scratch to electrically connect. Therefore, the scratch of the above-described size cannot be disregarded in terms of the production.

As described above, according to the method of manufacturing the semiconductor device of the present invention, after the CMP process, second plasma oxide film 6 is formed, and then, in accordance with the amount that is polished in the CMP process, etching is performed so that the smaller the polishing amount, the larger is the etching amount, for each divided part of the surface of the silicon oxide film. Therefore, second plasma oxide film 6 is buried into the scratch that is generated in the CMP process. Also, variations in the amount that is polished in the CMP process are reduced. Therefore, the surface of the silicon oxide film for covering wirings 3 is improved in the planarization, and then the surface of the silicon oxide film is parallel with the surface of the substrate. Accordingly, in a lithography process and an etching process to form wirings after that, variations in photoresist size in the surface of the substrate in the lithography process are reduced and variations in etching in the surface of the substrate in the etching process are reduced. As a result, the variations in wiring size are reduced, and the yields are improved compared with the conventional method.

Further, though variations in film thickness in the surface of the substrate are increased in the film formation process of forming second plasma film 6, the amount that will be removed by local etching can be controlled together with the variations in the amount that is polished in the CMP process so that the exposed surface of the silicon oxide film is eventually parallel with the surface of the substrate. In this case, deterioration in planarization caused by variations in the film thickness in the film formation process of second plasma oxide film 6 and by variations in the amount that is polished in the CMP process is prevented. Also, if variations in the film thickness in the film formation process of second plasma oxide film 6 is inverted with that of variations in the amount that is polished in the CMP process, the variations in the film thickness caused by the CMP process will be reduced, and local etching is further performed, thereby improving planarization in the exposed surface of the silicon oxide film.

Also, as shown in FIG. 2C, though the remaining film on wiring 3 in the center is thicker than in the periphery, by performing local etching which the thicker the remaining film, the larger is the etching amount, for each divided part of the surface of the silicon oxide film, the thickness of the remaining film on wiring 3 in the substrate is made even and planarization is attained. In this case, when via holes are formed on wirings 3 in the step subsequent to that, variations in diameters of hole patterns of photoresist are further reduced, and therefore the diameters of via holes formed on the remaining film are made more even in the surface of the substrate.

Further, though there is a plurality of films to undergo local etching, the film qualities are similar, and thus no step height is formed on the surface after the local etching. In the following, the reasons thereof are explained.

In the step shown in FIG. 2A, the upper surface of first plasma oxide film 1 on the chip is positioned at a level higher than that between chips. Accordingly, in the CMP process, the silicon oxide film on the chip is selectively polished compared with that between the chips. Therefore, as shown in FIG. 2B, only LP-TEOS oxide film 2 remains on the wirings in the periphery on the substrate, and not only LP-TEOS oxide film 2 but also first plasma oxide film 1 remain on the part that is between chips in the vicinity of the center. When local etching is performed in this situation, the difference of the etching rate is caused by the difference of film qualities between LP-TEOS oxide film 2 and first plasma oxide film 1. As a result, step heights are generated by the difference of the etching rates. In this embodiment, since the films that are to undergo local etching are first plasma oxide film 1 and second plasma oxide film 6 whose film qualities are equivalent, no step height is generated in the surface after the local etching.

Second Embodiment

In the first embodiment, silicon oxide film formed on wirings before the CMP process is the laminated film of LP-TEOS oxide film and plasma oxide film, however, in this second embodiment, a laminated film of a single-kind is used in which materials are equivalent but film qualities are different.

FIGS. 4A to 4D are schematic cross-sectional views showing a process of manufacturing a semiconductor device according to this embodiment. Incidentally, the same reference numerals are applied to the same structures as those shown in FIGS. 2A to 2D, and explanations thereof are omitted.

Figure 4A:
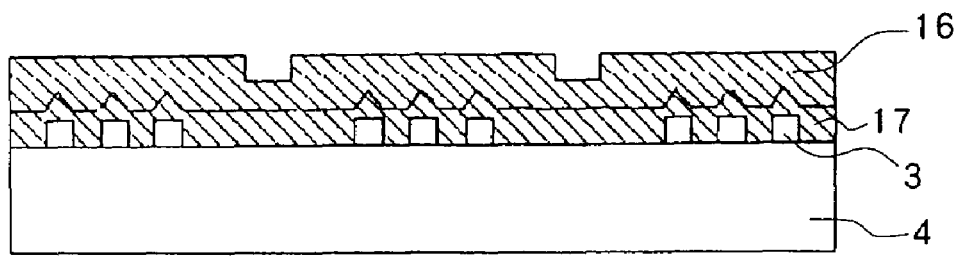
FIGS. 4A to 4D are schematic cross-sectional views showing a process of manufacturing a semiconductor device according to a second embodiment of the present invention.

As shown in FIG. 4A, similar to the first embodiment, on primary insulating layer 4, wirings 18 having a height of 600 nm are formed. A HDP (High Density Plasma) oxide film having a thickness of 1000 nm is formed thereon as an insulating film. The HDP oxide film includes first HDP oxide film 17 and second HDP oxide film 16 which are laminated.

The method of forming the HDP oxide film will be explained. In the film formation process of the HDP oxide film, when the sputtering action is strong, characteristics for embedding the HDP oxide film is improved, however, the film formation rate is degraded. Since first HDP oxide film 17 directly covers wirings 3, it is preferable that characteristics for embedding first HDP oxide film 17 be excellent. Therefore, first HDP oxide film 17 which must be embedded is formed under the condition that the sputtering action is strong.

Also, since second HDP oxide film 16, formed subsequently to that, is directly polished in the CMP process, second HDP oxide film 16 is preferably thicker than first HDP oxide film 17. Therefore, second HDP oxide film 16 is formed under the condition that the sputtering action is weak and the film formation rate is large. As a result, first HDP oxide film 17 is a tight HDP oxide film whose film composition density is high, while second HDP oxide film 16 is a rough HDP oxide film whose film composition density is low. Further, in order to prevent deterioration in throughput during the film formation process, first HDP oxide film 17 and second HDP oxide film 16 are formed sequentially in the same chamber.

Figure 4B:
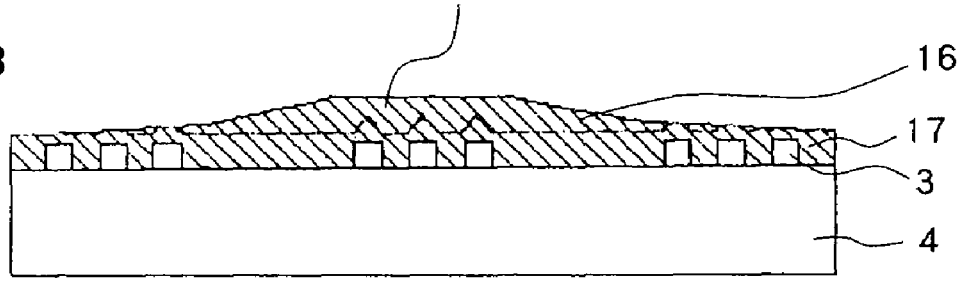

Successively, similar to the first embodiment, the silicon oxide film is polished by the CMP process until the step heights in second HDP oxide film 16 are eliminated (FIG. 4B). The CMP process is performed so that the polishing amount is 500 nm on average in the surface. The actual amount that is polished is about 450 nm in the center of the substrate and is about 550 nm in the periphery. These values of amounts that are polished are obtained from the measurements of thickness of film on monitor wafer.

Figure 4C:
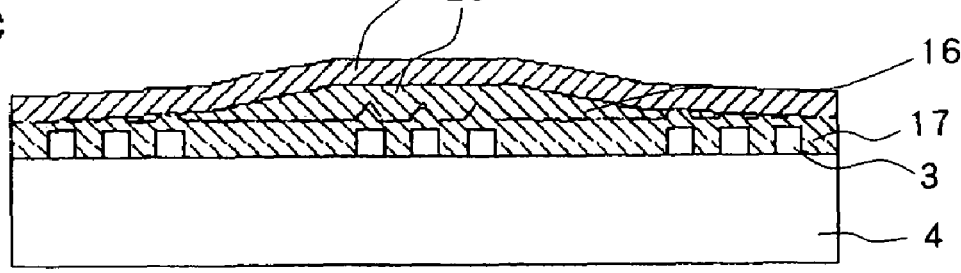

Further, as shown in FIG. 4C, plasma oxide film 21 having a thickness of 150 nm is formed. Accordingly, plasma oxide film 21 is buried into slight scratch 20 having a width of 300 nm or less that is generated in the CMP process.

Figure 4D:
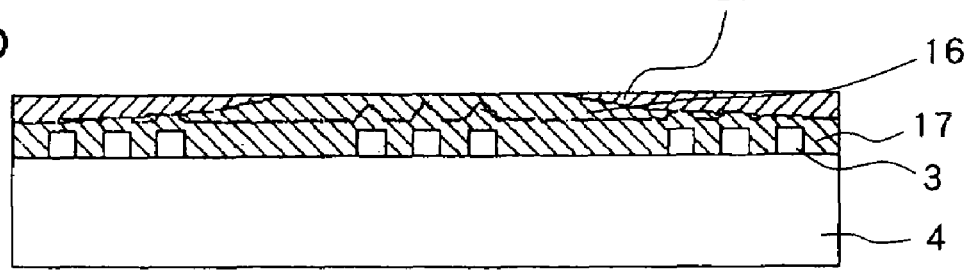

After that, similar to the first embodiment, local etching is performed in which the etching rate in the center of the substrate is faster than that in the periphery. The amount that was removed by local etching produced the result that 120 nm of silicon oxide film was removed in the vicinity of the center of the substrate and 20 nm was removed in the vicinity of the periphery. A greater amount of etching occurred in the part of the exposed surface of the silicon oxide film that is higher than the average and a smaller amount occurred in the part that is lower than the average so that variations in the amount that is polished according to the CMP process are reduced. Accordingly, as shown in FIG. 4D, the surface of the silicon oxide film is processed flatly and evenly. Also, scratches are eliminated by the local etching or plasma oxide film 21 is buried into scratches.

Incidentally, in this embodiment, since the film quality of plasma oxide film 21 is different from that of the HDP oxide film, it is preferable to stop the etching process when the surface of the HDP oxide film is exposed during the local etching. In this case, no step height is formed on the surface of the silicon oxide film.

As described above, according to the method of manufacturing the semiconductor device in this embodiment, second HDP oxide film 16 is made of materials equivalent to first HDP oxide film 17 and is formed under the condition in which the film formation rate is faster than that of first HDP oxide film 17. Since the film formed on wirings prior to the CMP process is a laminated film of a single-kind, the sequential processing can be performed in the same chamber and the throughput of the production of the semiconductor device is improved. Also, similar to the first embodiment, after the CMP process is completed, plasma oxide film 21 is formed, and then, in accordance with the amount that is polished in the CMP process, etching is performed so that the less the amount that is polished, the larger is the amount that is etched, for each divided part of the surface of the silicon oxide film. Therefore, plasma oxide film 21 is buried into scratches that are generated in the CMP process. Accordingly, the problem of the scratches can be solved.

In the first and second embodiments, explanations are given of the example in which the insulating film for covering the wirings is a multilayer film or a substantial multilayer film, however, the present invention may be applied to a single-layer film. In this case, scratches can be reduced. Also, the insulating film for covering the wirings is not limited to silicon oxide film, but a silicon nitride film or a film using other insulating materials may be used. A polysilicon film having an insulating property may be used in accordance with a voltage applied to the wirings.

Further, explanations are given of the semiconductor device in which the wirings are covered by the insulating film, however, the present invention may be applied to a semiconductor device in which at least one of the structures such as wirings and gate electrodes is covered by an insulating film.

While preferred embodiments of the present invention have been described using specific terms, such description is for illustrative purposes only, and it is to be understood that changes and variations may be made without departing from the spirit or scope of the following claims.

What is claimed is:

1. A method of manufacturing a semiconductor device, comprising:
    forming a first insulating film on a substrate that is provided with a structure;
    forming a second insulating film on said first insulating film;
    polishing at least said second insulating film;
    forming a third insulating film on the polished second insulating film; and
    local etching a remaining film including at least one of said second insulating film and said third insulating film such that an exposed surface of said second insulating film and said third insulating film is parallel with a surface of said substrate.

2. The method according to claim 1, wherein in said etching, based on an amount that is polished during said polishing, the smaller the amount that is polished, the larger is the amount that is etched.

3. The method according to claim 1, wherein a plurality of structures are previously provided on said substrate, and
    wherein in said etching, in a part on the structure, the thicker the remaining film, the larger is an amount that is etched.

4. The method according to claim 1, wherein said second insulating film and said third insulating film are equivalent in film quality.

5. The method according to claim 1, wherein said second insulating film comprises materials equivalent to said first insulating film.

6. The method according to claim 1, wherein said local etching comprises etching the remaining film including said second insulating film and said third insulating film.

7. The method according to claim 1, wherein the structure comprises a wiring for connecting a terminal of the semiconductor device to a semiconductor element.

8. The method according to claim 1, further comprises:
    depositing a film of wiring material on a primary insulating layer; and
    forming wirings by lithography and etching processes on the film of wiring material prior to forming the first insulating film.

9. The method according to claim 1, wherein the structure comprises a plurality of chips disposed in a peripheral region and a central region of the substrate.

10. The method according to claim 9, wherein said forming the second insulating layer comprises forming an upper surface of the second insulating layer on each of said plurality of chips at a level that is higher than an area between two adjacent chips in said plurality of chips to form step heights.

11. The method according to claim 10, wherein said polishing terminates when the step heights are eliminated.

12. The method according to claim 9, wherein said polishing comprises selectively polishing the second insulating film on each of said plurality of chips compared to an area between two adjacent chips in said plurality of chips.

13. The method according to claim 9, wherein after said polishing, only the first insulating film remains on the structure in the peripheral regions, and
    wherein after said polishing, the first insulating film and the second insulating film remain in the centeral region.

14. The method according to claim 1, wherein the structure comprises a plurality of chips disposed in the substrate,
    wherein said forming the second insulating layer comprises forming an upper surface of the second insulating layer on each of said plurality of chips at a level that is higher than an area between two adjacent chips in said plurality of chips to form step heights, and
    wherein said polishing terminates when the step heights are eliminated.

15. The method according to claim 1, wherein a location of said polishing is based on measurements of thickness of the second insulating film on a monitor wafer.

16. The method according to claim 1, wherein said local etching is faster in a center of the substrate than in a periphery of the substrate.

17. The method according to claim 1, wherein said local etching comprises moving the substrate by a stage,
    wherein a moving speed of the stage has a first speed in a part where an amount that is polished in said polishing is large, and the moving speed of the stage has a second speed, slower than said first speed, in a part where the amount that is polished in said polishing is small.

18. The method according to claim 1, wherein the remaining film in a center of the substrate is thicker than the remaining film in the periphery of the substrate.

19. The method according to claim 1, wherein said first insulating film and said second insulating film comprise different film qualities.

20. The method according to claim 1, wherein the first insulating film has a high composition density and the second insulating film has a low composition density.

* * * * *